(12) United States Patent
Walk et al.

(10) Patent No.: US 7,042,077 B2
(45) Date of Patent: May 9, 2006

(54) INTEGRATED CIRCUIT PACKAGE WITH LOW MODULUS LAYER AND CAPACITOR/INTERPOSER

(75) Inventors: Michael J. Walk, Mesa, AZ (US); Hamid Azimi, Chandler, AZ (US); John S. Guzek, Chandler, AZ (US); Charan K. Gurumurthy, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 10/825,400

(22) Filed: Apr. 15, 2004

(65) Prior Publication Data

US 2005/0230841 A1   Oct. 20, 2005

(51) Int. Cl.
*H01L 23/02* (2006.01)

(52) U.S. Cl. ................... 257/686; 257/778; 438/109
(58) Field of Classification Search ............... None
See application file for complete search history.

(56) References Cited

U.S. PATENT DOCUMENTS

| | | | |
|---|---|---|---|
| 5,177,594 A * | 1/1993 | Chance et al. | 257/678 |
| 5,239,448 A * | 8/1993 | Perkins et al. | 361/764 |
| 6,734,540 B1 * | 5/2004 | Fritz | 257/686 |

\* cited by examiner

*Primary Examiner*—Leonardo Andújar
(74) *Attorney, Agent, or Firm*—Buckley, Maschoff & Talwalkar LLC

(57) ABSTRACT

A system may include a coreless substrate, a layer of material attached to the substrate, the layer of material having a lower elastic modulus than the substrate, an interposer coupled to the layer of material, and a capacitive layer coupled to the interposer.

19 Claims, 12 Drawing Sheets ated circuit (IC) die may include electrical devices that are integrated with a semiconductor substrate. The IC die may also include conductive paths that electrically couple the electrical devices to one another and to external connections. The die may include several layers of conductive paths, with each layer separated from adjacent layers by an inter-layer dielectric (ILD). The ILD may comprise material having an extremely low dielectric constant (k) in order to minimize capacitance coupling and crosstalk between the conductive paths.

INTEGRATED CIRCUIT PACKAGE WITH LOW MODULUS LAYER AND CAPACITOR/INTERPOSER

BACKGROUND

An integrated circuit (IC) die may include electrical devices that are integrated with a semiconductor substrate. The IC die may also include conductive paths that electrically couple the electrical devices to one another and to external connections. The die may include several layers of conductive paths, with each layer separated from adjacent layers by an inter-layer dielectric (ILD). The ILD may comprise material having an extremely low dielectric constant (k) in order to minimize capacitance coupling and crosstalk between the conductive paths.

Low-k ILD materials often exhibit a coefficient of thermal expansion (CTE) that differs from other elements to which they are coupled, such as the other elements of the IC die and elements of an IC substrate to which the IC die is coupled. Moreover, low-k ILD materials are often brittle. These two characteristics may cause low-k ILD materials to crack during IC die fabrication and/or IC package to IC die assembly.

A power source such as a voltage regulator may provide power signals to an IC substrate/die package during operation. When the IC die transitions from a relatively idle state to a relatively active state, the resulting demand on the power source typically causes the power signals to exhibit a "first droop". The magnitude of the first droop may be decreased by adding capacitance to the power delivery system. According to some approaches, capacitance is added by mounting chip capacitors on a die side and/or a land side of the IC substrate. Using these approaches, it can be difficult and/or inefficient to provide an amount of capacitance that will sufficiently decrease the magnitude of the first droop while keeping the inductance of the power delivery system low enough to result in a desired IC package performance.

DETAILED DESCRIPTION

Figure 1:
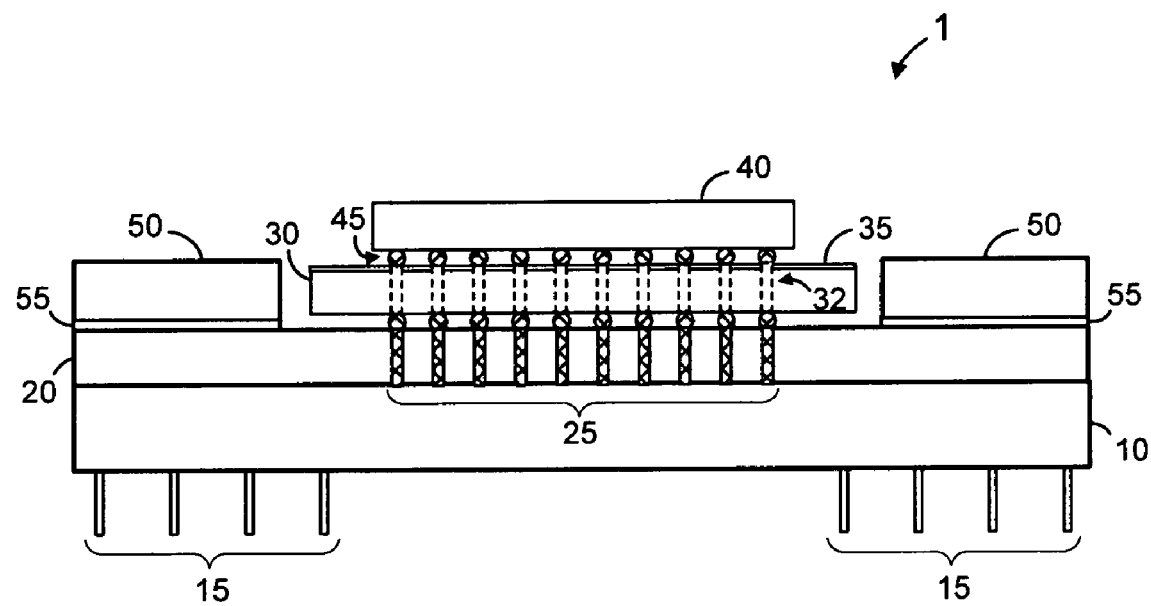
FIG. 1 is a cross-sectional side view of an apparatus according to some embodiments.

FIG. 1 is a cross-sectional side view of apparatus 1 according to some embodiments. Apparatus 1 may comprise any IC package, including but not limited to a microprocessor, a network processor, a controller hub, and a chipset. Apparatus 1 of FIG. 1 includes IC substrate 10, low modulus layer 20, interposer 30, IC die 40, and other elements.

IC substrate 10 comprises a coreless substrate according to some embodiments. IC substrate 10 may comprise any ceramic, organic, and/or other suitable material. Any currently- or hereafter-known coreless substrate may be used in conjunction with some embodiments.

According to some embodiments, IC substrate 10 comprises multiple stacked layers of dielectric material that are separated by planes of conductive traces. One plane of conductive traces may be coupled to one or more other planes of conductive traces by vias fabricated within the layers of dielectric material. The dielectric material may comprise any suitable currently- or hereafter-known material or materials, including but not limited to epoxy and glass cloth and epoxy build up material. Other resin materials such as polyimid, polyolefin and cyanate ester could also comprise dielectric material. According to some embodiments, a lower-most layer of substrate 10 comprises epoxy and glass cloth or low CTE alloy. Layers stacked on the lower-most layer comprise any of the materials mentioned above, including epoxy and glass cloth or epoxy build up material.

IC substrate 10 is coupled to through hole pins 15 for carrying power and I/O signals between elements of apparatus 1 and external devices. For example, through hole pins 15 may be mounted directly to a motherboard (not shown) or onto a socket that is in turn mounted directly to a motherboard. Alternative interconnects such as solder balls may be used instead of pins 15 to mount apparatus 1 to a motherboard, a socket, or another substrate.

Low modulus layer 20 may comprise any material having a lower elastic modulus than substrate 10. More particularly, low modulus layer 20 may have a lower elastic modulus than the portion of IC substrate 10 to which it is attached. Low modulus layer 20 may be composed of any currently- or hereafter-known material or materials, including but not limited to epoxy compounds, rubber compounds, silicone-based compounds, polytetrafluoroethylene, and thermoplastics. Layer 20 may be laminated to IC substrate 10 during fabrication of apparatus 1.

Layer 20 defines openings to pass solder columns 25. Solder columns 25 may be fabricated using currently- or hereafter-known systems, and may be coupled to electrical contacts (not shown) of substrate 10 and to electrical contacts (not shown) of interposer 30. Interposer 30 may comprise a low-CTE material. Interposer 30 comprises ceramic or silicon according to some embodiments. Interposer 30 may define a plurality of vias 32 coupled to respective ones of solder columns 25.

FIG. 1 shows capacitor 35 coupled to interposer 30. Capacitor 35 may comprise a thin-film capacitor having one or more layers. Some embodiments of capacitor 35 comprise a ceramic material such as BST or $BaTiO_3$. Capacitor 35 may be coupled to interposer 30 using any suitable currently- or hereafter-known systems, including but not limited to chemical vapor deposition, sputtering, slurry-based systems, and spray-based systems.

IC die 40 is coupled to interposer 30. In the illustrated embodiment, IC die 40 is coupled to interconnects 45 that are in turn coupled to electrical contacts (not shown) of interposer 30. IC die 40 includes integrated electrical devices and may be fabricated using any suitable material and fabrication techniques. IC die 40 may provide one or more functions. Interconnects 45 may be electrically coupled to the electrical devices that are integrated into IC die 40.

According to some embodiments, layer 20 may provide stress relief to apparatus 1 during exposure to elevated temperatures and/or may improve the reliability of an interconnection between substrate 10 and interposer 30. Interposer 30 may also reduce stress on die 40 during exposure to elevated temperatures. Moreover, the presence of capacitor 35 may decrease the magnitude of the above-described first droop and the proximity of capacitor 35 to IC die 40 may ensure a low inductance of power supplied to IC die 40.

Stiffener 50 may be coupled to low modulus layer 20 by adhesive 55. Stiffener 50 may comprise any suitable material, including but not limited to a temperature-resistant polymer. Stiffener 50 may cause apparatus 1 to deform less in response to environmental and operational conditions than apparatus would otherwise deform in the absence of stiffener 50. Although not apparent from the FIG. 1 cross-sectional view, stiffener 50 surrounds interposer 30 according to some embodiments.

Figure 2:
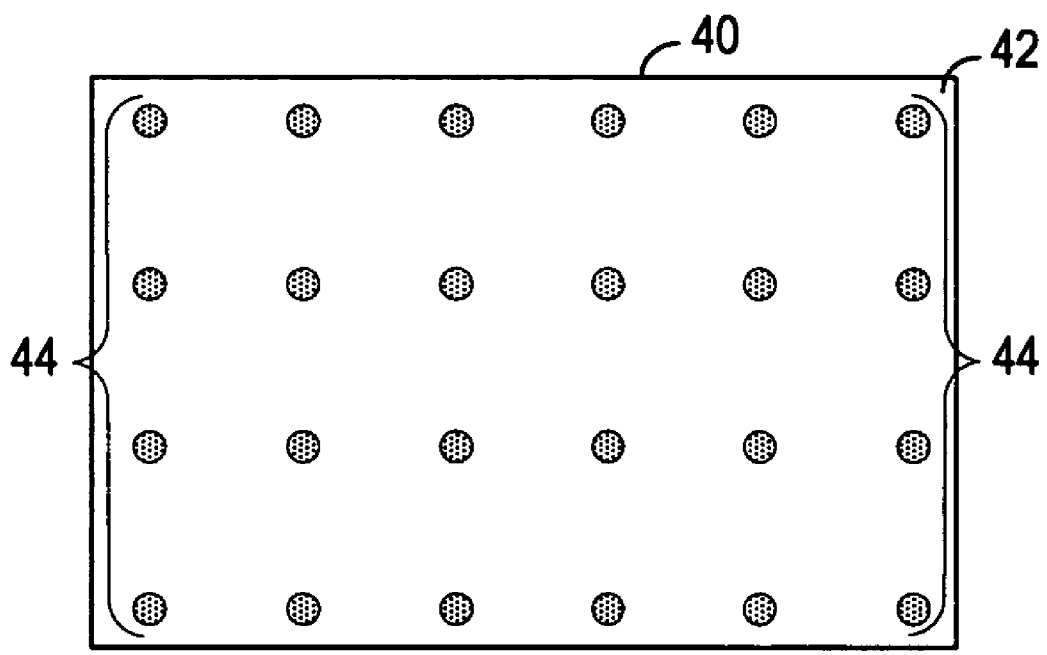
FIG. 2 is a bottom view of an IC die according to some embodiments.

FIG. 2 illustrates side 42 of IC die 40 according to some embodiments. Side 42 of IC die 40 includes electrical contacts 44. IC die 40 may comprise a flip chip arrangement in which the electrical devices that are integrated therein reside between a substrate of IC die 40 and electrical contacts 44. In some embodiments, the substrate resides between the electrical devices and electrical contacts 44.

Electrical contacts 44 may comprise copper or lead-based contacts fabricated upon IC die 40. Electrical contacts 44 may comprise interconnects 45 of FIG. 1 in a case that electrical contacts 44 are Controlled Collapse Chip Connect (C4) solder bumps. Electrical contacts 44 may be recessed under, flush with, or extending above first side 42 of IC die 40. Electrical contacts 44 may be electrically coupled to the electrical devices that are integrated into IC die 40. Although the embodiments of FIGS. 2, 3a, 3b and 4 show electrical contacts having substantially square or circular cross section, in other embodiments one or more electrical contacts have cross sections of different and/or varying shapes.

Figure 3A:
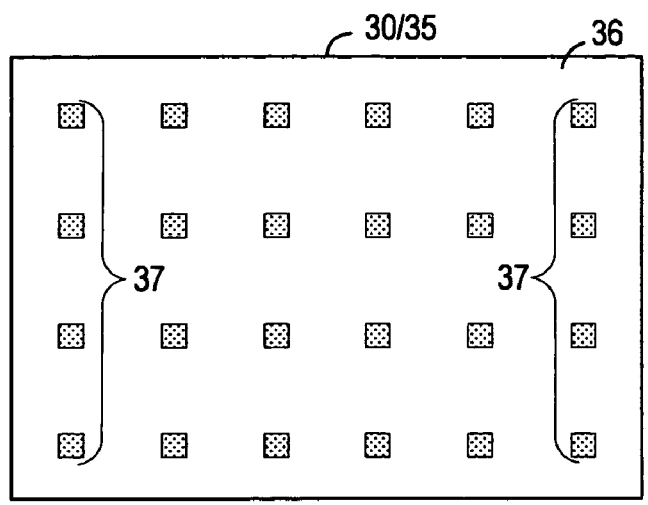
FIG. 3a is a top view and FIG. 3b is a bottom view of an interposer according to some embodiments.
Figure 3B:
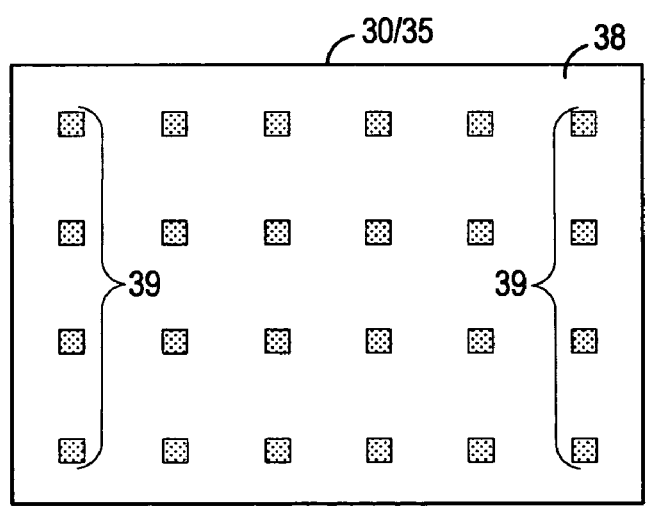

FIG. 3a is a view of side 36 of interposer/capacitor 30/35. Side 36 is coupled to die 40 in the FIG. 1 embodiment and therefore interposer 30 is obscured by capacitor 35 in FIG. 3a. Side 36 comprises electrical contacts 37 of any suitable type. Electrical contacts 37 may be disposed on or be otherwise integral to capacitor 35 and/or may pass through openings defined by capacitor 35. Side 38 of interposer/capacitor 30/35 is shown in FIG. 3b. Side 38 is coupled to low modulus layer 20 and therefore capacitor 35 is not visible in FIG. 3b. Electrical contacts 39 may comprise any suitable type of electrical contacts. One or more of electrical contacts 39 may be electrically coupled to one or more of electrical contacts 37 of side 36. According to some embodiments, vias defined by interposer 30 electrically couple each one of electrical contacts 39 to a respective one of electrical contacts 37.

Figure 4:
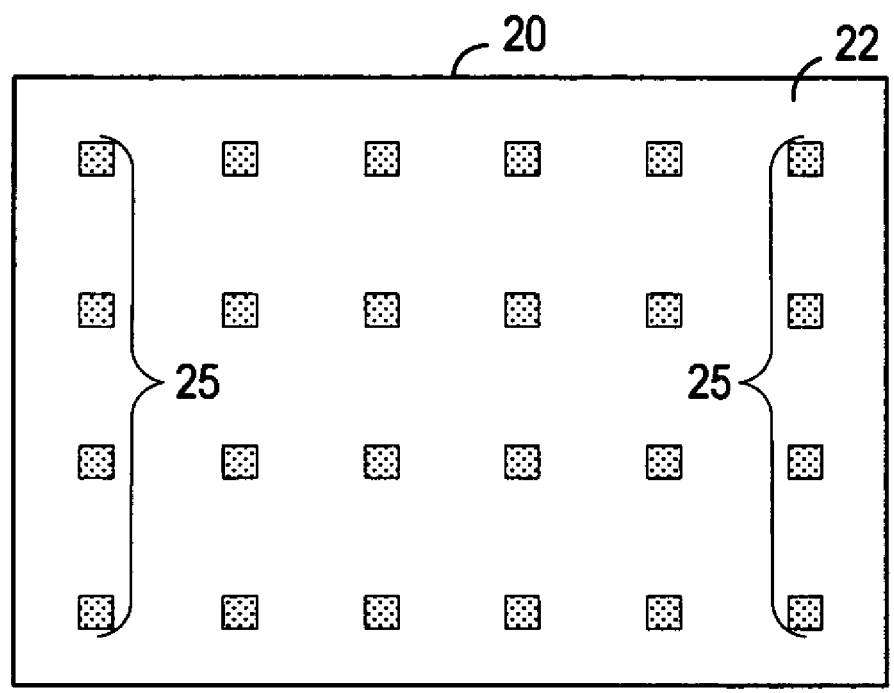
FIG. 4 is a bottom view of a layer of material according to some embodiments.

FIG. 4 is a view of side 22 of low modulus layer 20 according to some embodiments. Side 22 may be coupled to interposer 30. Side 22 includes solder columns 25, which are shown in cross-section in FIG. 1. Solder columns 25 may pass through openings defined by layer 20 and may be coupled to respective ones of electrical contacts 39 of interposer 30.

Figure 5:
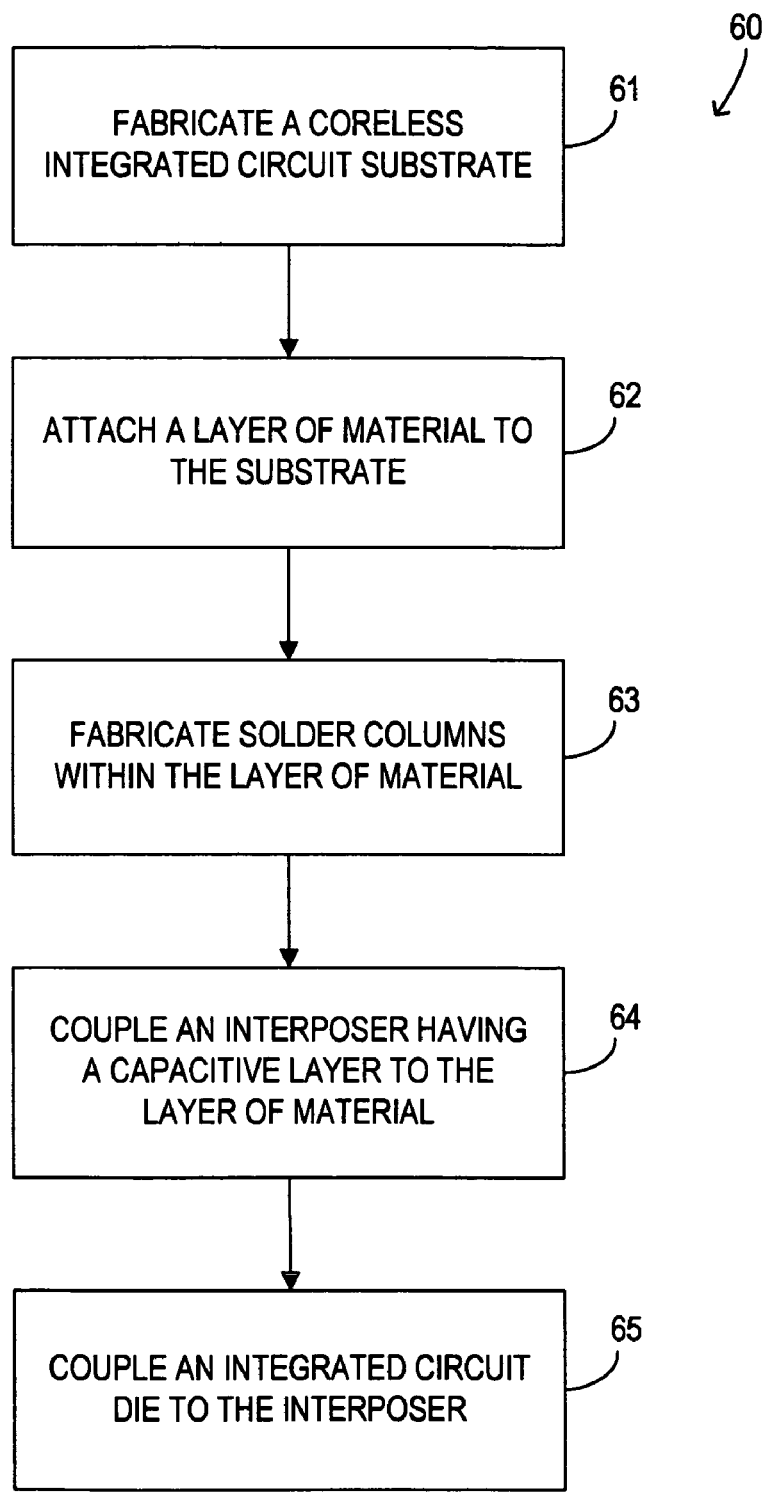
FIG. 5 is a diagram of a process to fabricate the FIG. 1 apparatus according to some embodiments.

FIG. 5 is a diagram of process 60 according to some embodiments. Process 60 may be executed by one or more fabrication devices, and all or a part of process 60 may be executed manually. Process 60 may be used to fabricate an apparatus such as apparatus 1 of FIG. 1.

Figure 6:
FIG. 6 is a side elevation of a coreless IC substrate according to some embodiments.
Figure 7:
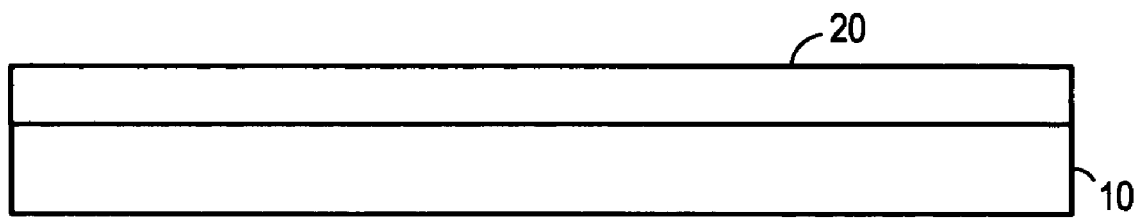
FIG. 7 is a side elevation of a coreless IC substrate and a layer of material according to some embodiments.

A coreless IC substrate is fabricated at 61. The coreless IC substrate may be fabricated according to any currently- or hereafter-known system. FIG. 6 is a side elevation of coreless IC substrate 10 according to some embodiments. A layer of material is attached to the coreless IC substrate at 62. The layer of material may have a lower elastic modulus than the IC substrate. The layer of material may be built up on the IC substrate using currently- or hereafter-known deposition techniques. According to some embodiments, the layer of material is laminated onto the IC substrate in a partially-cured form. FIG. 7 is a side elevation of IC substrate 10 having layer 20 attached thereto according to some embodiments.

Figure 8:
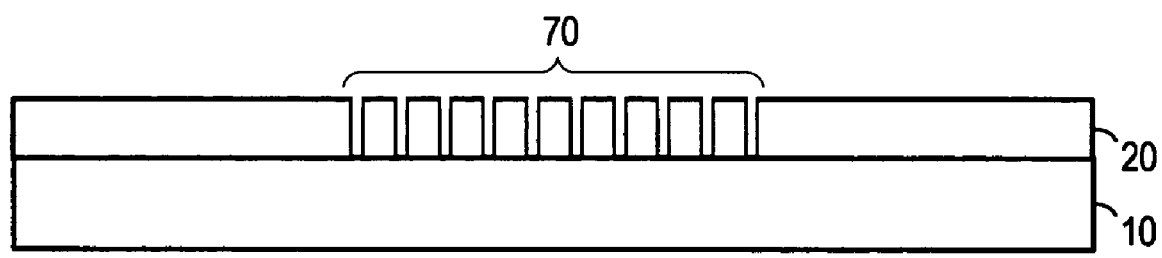
FIG. 8 is a cutaway side elevation of a coreless IC substrate and a layer of material according to some embodiments.
Figure 9:
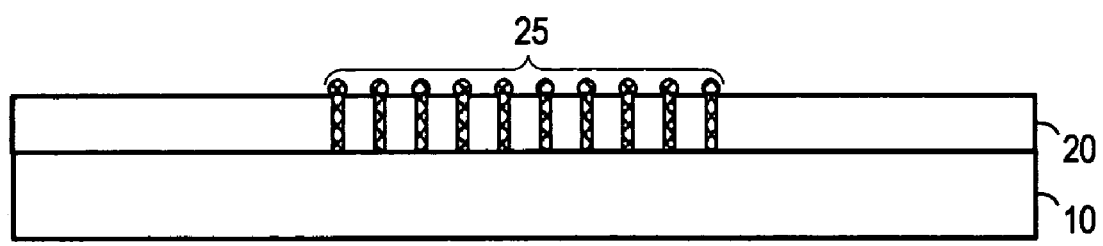
FIG. 9 is a cutaway side elevation of a coreless IC substrate and a layer of material according to some embodiments.

Next, at 63, solder columns are fabricated within the layer of material. Fabrication of solder columns may comprise creating openings 70 in layer 20 as shown in FIG. 8. Openings 70 may be created at locations corresponding to electrical contacts (not shown) disposed on a top side of coreless substrate 10. The electrical contacts may be coupled to one or more layers of conductive traces of substrate 10 for routing electrical signals through substrate 10. Openings 70 may be created by laser drilling, chemical etching, and/or other currently- or hereafter-known systems. Openings 70 may then be filled with solder material to create solder columns 25 therein as shown in FIG. 9. Solder columns 25 may therefore be electrically coupled to the aforementioned one or more layers of conductive traces.

Figure 10:
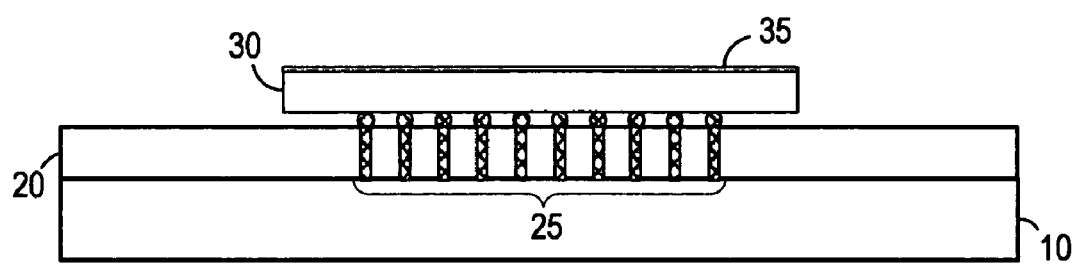
FIG. 10 is a cutaway side elevation of a coreless IC substrate, a layer of material and an interposer according to some embodiments.

An interposer having a capacitive layer is coupled to the low modulus layer at 64. FIG. 10 is a cutaway side elevation of substrate 10, low modulus layer 20, solder columns 25, interposer 30 and capacitor 35 after the coupling at 64. Interposer 30 may be placed on solder columns 25 at 64 so as to align electrical contacts 39 of interposer 30 with respective ones of solder columns 25. The device of FIG. 10 may be heated at 64 to partially or completely fuse solder columns 25 and respective ones of electrical contacts 39.

Figure 11:
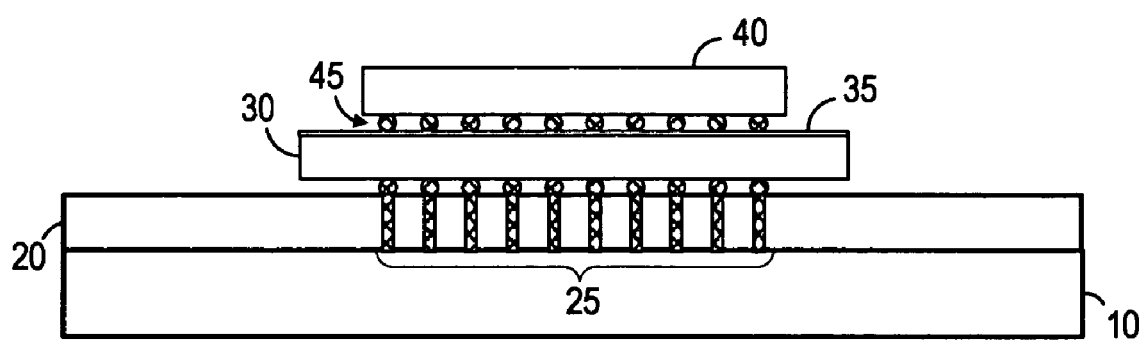
FIG. 11 is a cutaway side elevation of a coreless IC substrate, a layer of material, an interposer and an IC die according to some embodiments.

An IC die is then coupled to the interposer at 65. FIG. 11 illustrates one example of a system after 65. According to some embodiments, IC die 40 is placed on interposer 30 using a placement head of a pick-and-place machine. Such a machine may align electrical contacts 44 of IC die 40 with respective ones of electrical contacts 37 prior to placing IC die 40 thereon. The FIG. 11 system may then be heated in order to form integral electrical connections between IC die 40 and the interposer 30 such as interconnects 45.

Process 60 may provide an apparatus exhibiting stress relief during exposure to elevated temperatures and/or improved reliability of an interconnection between substrate 10 and interposer 30. The apparatus may decrease the magnitude of a first power droop while reducing an inductance of power supplied to IC die 40.

As shown in FIG. 1, stiffener 50 may be coupled to low modulus layer 20 after 65. A side of stiffener 50 that contacts layer 20 may be coated with adhesive 55 to assist the coupling. Such an adhesive may comprise a partially-cured, solid epoxy. Interconnects such as pins 15 and solder balls may be attached to IC substrate 10 after 65.

Figure 12:
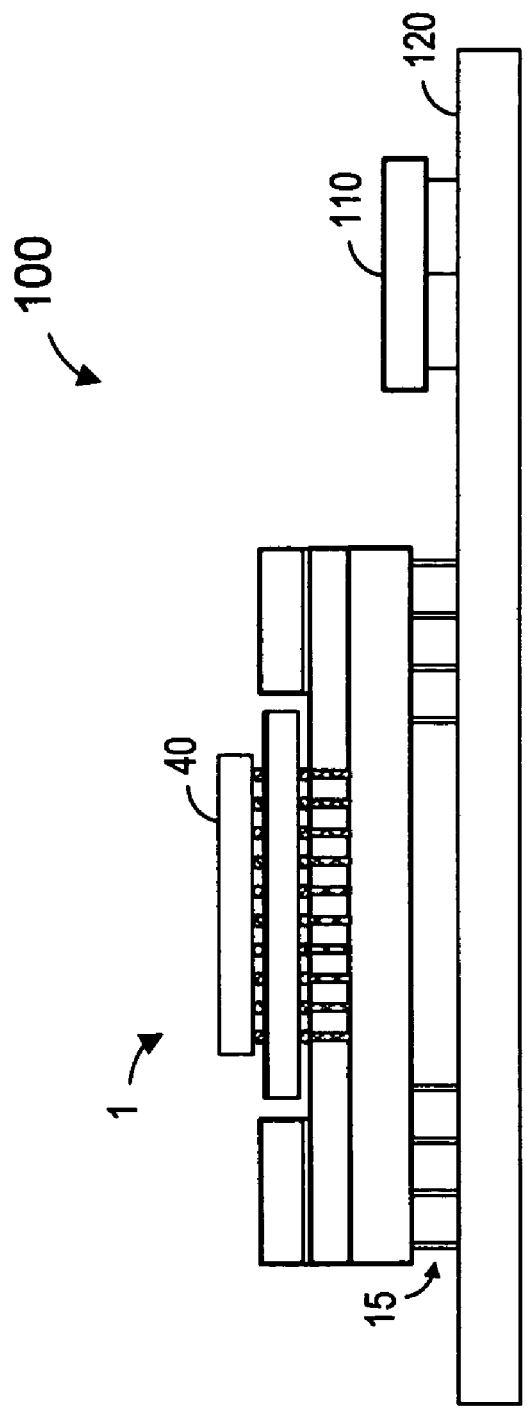
FIG. 12 is a diagram of a system according to some embodiments.

FIG. 12 is a side elevation of system 100 according to some embodiments. System 100 may comprise components of a desktop computing platform. System 100 includes apparatus 1 as described above, memory 110 and motherboard 120. Apparatus 1 of system 100 may comprise a microprocessor.

Pins 15 may carry signals such as power and I/O signals between IC die 40 and external devices. Pins 15 may be mounted directly on motherboard 120 or onto a socket (not shown) that is in turn mounted directly to motherboard 120. Motherboard 120 may comprise a memory bus (not shown) that is electrically coupled to pins 15 and to memory 110. Motherboard 120 may therefore electrically couple memory 110 to IC die 40. Memory 110 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
   a coreless substrate;
   a layer of material attached directly to an upper side of the substrate, the layer of material having a lower elastic modulus than the substrate;
   an interposer coupled to the layer of material;
   a plurality of solder columns to couple the interposer to the substrate;
   an integrated circuit die coupled to a plurality of solder balls; and
   a capacitive layer attached to an upper side of the interposer,
   wherein the interposer defines a plurality of vias to couple the plurality of solder columns to the plurality of solder balls.

2. An apparatus according to claim 1, further comprising:
   an integrated circuit die coupled to the capacitive layer.

3. An apparatus according to claim 2, wherein the capacitive layer is disposed between the interposer and the integrated circuit die.

4. An apparatus according to claim 1, the layer of material defining openings to pass the plurality of solder columns.

5. An apparatus according to claim 1,
   wherein the layer of material is laminated to the substrate.

6. An apparatus according to claim 1, further comprising:
   a stiffener attached to the layer of material.

7. An apparatus according to claim 6, wherein the stiffener surrounds the interposer.

8. An apparatus according to claim 1, wherein a lower side of the interposer is coupled to the layer of material.

9. A method comprising:
   fabricating a coreless substrate;
   attaching a layer of material directly to an upper side of the substrate, the layer of material having a lower elastic modulus than the substrate;
   fabricating solder columns within the layer of material;
   coupling an interposer having a capacitive layer to the layer of material; and
   fabricating a plurality of solder balls on the interposer, the interposer defining a plurality of vias to couple the plurality of solder columns to the plurality of solder balls,
   wherein the capacitive layer is attached directly to an upper side of the interposer.

10. A method according to claim 9, wherein coupling the interposer to the layer of material comprises:
    coupling the interposer to the solder columns.

11. A method according to claim 9, further comprising:
    coupling an integrated circuit die to the plurality of solder balls.

12. A method according to claim 9, further comprising:
    coupling an integrated circuit die to the interposer.

13. A method according to claim 12, wherein coupling the integrated circuit die to the interposer comprises:
    coupling the integrated circuit die to the capacitive layer.

14. A system comprising:
    a microprocessor comprising:
       a coreless substrate;
       a layer of material attached directly to an upper side of the substrate, the layer of material having a lower elastic modulus than the substrate;
       an interposer coupled to the layer of material;
       a plurality of solder columns to couple the interposer to the substrate;
       an integrated circuit die coupled to a plurality of solder balls; and
       a capacitive layer attached coupled to an upper side of the interposer; and
    a double data rate memory electrically coupled to the microprocessor,
    wherein the interposer defines a plurality of vias to couple the plurality of solder columns to the plurality of solder balls.

15. A system according to claim 14, wherein the integrated circuit die is coupled to the capacitive layer.

16. A system according to claim 15, wherein the capacitive layer is disposed between the interposer and the integrated circuit die.

17. A system according to claim 14, further comprising:
    a stiffener attached to the layer of material.

18. A system according to claim 14, wherein a lower side of the interposer is coupled to the layer of material.

19. A system according to claim 14, further comprising:
    a motherboard electrically coupled to the microprocessor and to the memory.

* * * * *